US010254646B2

(12) United States Patent
Arias et al.

(10) Patent No.: US 10,254,646 B2
(45) Date of Patent: Apr. 9, 2019

(54) COMPOSITION SENSITIVE TO RADIATION IN ELECTROMAGNETIC SPECTRUM RANGES FOR PRINTING PURPOSES, PRINTING PLATE COMPRISING SAID COMPOSITION, USE OF SAID COMPOSITION AND IMAGE DEVELOPMENT PROCESS

(71) Applicant: IBF INDUSTRIA BRASILEIRA DE FILMES S/A, Rio de Janeiro—RJ (BR)

(72) Inventors: Andre Luiz Arias, Rio de Janeiro (BR); Luiz Nei Arias, Rio de Janeiro (BR); Marjorie Arias, Rio de Janeiro (BR); Mario Italo Provenzano, Rio de Janeiro (BR)

(73) Assignee: IBF INDUSTRIA BRASILEIRA DE FILMES S/A, Rio de Janeiro (BR)

( * ) Notice: Subject to any disclaimer, the term of this patent is extended or adjusted under 35 U.S.C. 154(b) by 0 days.

(21) Appl. No.: 14/654,313

(22) PCT Filed: Dec. 19, 2012

(86) PCT No.: PCT/BR2012/000519
§ 371 (c)(1),
(2) Date: Oct. 12, 2015

(87) PCT Pub. No.: WO2014/094080
PCT Pub. Date: Jun. 26, 2014

(65) Prior Publication Data
US 2016/0026080 A1 Jan. 28, 2016

(51) Int. Cl.
*G03F 7/033* (2006.01)
*G03F 7/029* (2006.01)
*G03F 7/031* (2006.01)
*G03C 1/73* (2006.01)
*B41N 1/04* (2006.01)
*G03F 7/20* (2006.01)
*G03F 7/32* (2006.01)
*G03F 7/38* (2006.01)
*G03F 7/027* (2006.01)
*G03F 7/085* (2006.01)
*G03F 7/09* (2006.01)
*G03F 7/105* (2006.01)

(52) U.S. Cl.
CPC ............ *G03F 7/033* (2013.01); *B41N 1/04* (2013.01); *G03C 1/73* (2013.01); *G03F 7/027* (2013.01); *G03F 7/029* (2013.01); *G03F 7/031* (2013.01); *G03F 7/085* (2013.01); *G03F 7/092* (2013.01); *G03F 7/105* (2013.01); *G03F 7/20* (2013.01); *G03F 7/2002* (2013.01); *G03F 7/32* (2013.01); *G03F 7/38* (2013.01)

(58) Field of Classification Search
CPC ...................................................... G03F 7/022
See application file for complete search history.

(56) References Cited

U.S. PATENT DOCUMENTS

| 4,665,124 | A | 5/1987 | Walls et al. |
| 4,940,646 | A | 7/1990 | Pawlowski |
| 5,169,897 | A | 12/1992 | Walls |
| 5,169,898 | A | 12/1992 | Walls et al. |
| 5,700,619 | A | 12/1997 | Baumann et al. |
| 5,705,309 | A | 1/1998 | West et al. |
| 5,858,604 | A | 1/1999 | Takeda et al. |
| 5,912,105 | A | 6/1999 | Haberhauer et al. |
| 5,955,238 | A | 9/1999 | Yokoya et al. |
| 6,010,824 | A | 1/2000 | Komano et al. |
| 6,017,677 | A | 1/2000 | Maemoto et al. |
| 6,022,668 | A | 2/2000 | Burberry et al. |
| 6,037,098 | A | 3/2000 | Aoai et al. |
| 6,218,076 | B1 | 4/2001 | Ogata et al. |
| 6,232,038 | B1 | 5/2001 | Takasaki et al. |
| 7,955,776 | B2 | 6/2011 | Baumann et al. |
| 2001/0018164 | A1 | 8/2001 | Furukawa |
| 2003/0165774 | A1 | 9/2003 | Arias et al. |
| 2003/0180654 | A1 | 9/2003 | Fuss et al. |
| 2007/0202434 | A1* | 8/2007 | Arias ................. G03F 7/029 430/270.1 |
| 2010/0209851 | A1* | 8/2010 | Williamson .......... B41C 1/1008 430/302 |

FOREIGN PATENT DOCUMENTS

| BR | 0109106 A | 12/2002 |
| BR | 0102218 A | 5/2003 |
| BR | PI0400607 A | 9/2005 |

(Continued)

OTHER PUBLICATIONS

Derwent text of JP 04-161383, Jun. 1992, Fukuda, K.*
International Search Report and Written Opinion for International Application No. PCT/BR2012/000519, dated Jun. 7, 2013.
International Preliminary Examination Report for International Application No. PCT/BR2012/000519, dated Mar. 5, 2015.
Translation of the Written Opinion from corresponding International Patent Application No. PCT/BR2012/000519 dated Dec. 10, 2014.

(Continued)

Primary Examiner — Chanceity N Robinson
(74) Attorney, Agent, or Firm — Alston & Bird LLP

(57) ABSTRACT

Provided is a composition that is sensitive to radiation in electromagnetic spectrum ranges for printing purposes, and includes (a) one or more binder polymers; (b) an ethylenically unsaturated compound; (c) one or more compounds that absorbs radiations in the selected region of the spectrum; (d) a sensitizer; (e) optionally a photoaccelarator; (f) an adhesion promoter; (g) a dye; and (h) optionally thermal polymerization inhibitors. Also provided is a printing plate including the radiation sensitive composition, as well as the use of the composition and an image developing process.

20 Claims, No Drawings

(56) References Cited

FOREIGN PATENT DOCUMENTS

| BR | 0318515 A | | 9/2006 | |
|---|---|---|---|---|
| EP | 0411839 A2 | * | 7/1990 | |
| EP | 0 411 839 | | 2/1991 | |
| EP | 1349006 | | 1/2003 | |
| JP | 04-161383 | * | 6/1992 | |
| WO | WO 2007/009580 | | 1/2007 | |
| WO | WO 2007009580 A2 | * | 1/2007 | ........... B41C 1/1008 |

OTHER PUBLICATIONS

Translation of the International Preliminary Report on Patentability from corresponding International Patent Application No. PCT/BR2012/000519 dated Dec. 10, 2014.
Extended European Search Report for corresponding European Application No. 12890281.4 dated Aug. 12, 2016, 4 pages.

* cited by examiner

COMPOSITION SENSITIVE TO RADIATION IN ELECTROMAGNETIC SPECTRUM RANGES FOR PRINTING PURPOSES, PRINTING PLATE COMPRISING SAID COMPOSITION, USE OF SAID COMPOSITION AND IMAGE DEVELOPMENT PROCESS

CROSS-REFERENCE TO RELATED APPLICATIONS

This application is a national stage application filed under 35 U.S.C. § 371 of International Application No. PCT/BR2012/000519, filed Dec. 19, 2012, which is incorporated by reference herein in its entirety.

FIELD

The present invention refers to composition sensitive to radiation in electromagnetic spectrum ranges for printing purposes, to printing plates comprising said composition, to the use of said composition, as well as image development process.

BACKGROUND

Among the existing rules, rule ISO14.001—Environmental Management System—has been created to help public or private companies to identify, prioritize and manage their environmental risks as part of their usual practices. Rule ISO14.001 requires the companies to undertake to prevent pollution and make continuous improvements, as a part of each normal cycle of company management. The strict follow-up of each step of the operational manufacture process is a compulsory procedure to guarantee the balance of the environment and the continuous improvement of life quality.

The offset printing machines use an aluminum plate having an engraved image, which serves as a matrix for printing. This aluminum plate is fixed to the printer cylinder, and the latter, upon turning, enables the plate to be loaded with ink in the image area (oleophilic area) when it passes through the inking rollers and then to retain water in the non-image area (hydrophilic area) in contacting the so-called "wetting" cylinders, which remain immersed in an aqueous solution called strong solution. The ink of the image area is transferred to a special rubber web fixed to the other cylinder that carries the ink to the paper.

The process of using planographic printing matrices on an aluminum substrate generates industrial waste that today forces the graphic industry to segregate and pay for the correct disposal thereof. The developers are the great villains, because they have an extremely alkaline pH and cannot be discarded without due treatment for pH neutralization. Each offset plate or planographic printing matrix is determined by the photographic sensitiveness to a determined source of light, which may come from one of the following spectral ranges: Thermal or Infrared range (800~830 nm), Violet (405~410 nm) or Ultraviolet (<400 nm) range.

At present, on the market there are plates sensitive to UV (ultraviolet) radiation of the spectrum (320 nm), called conventional (analog), plates sensitive to infrared radiation of the spectrum (830 nm), called digital (thermal plates), and plates sensitive to violet radiation of the spectrum (410 nm), called photopolymer. In general, in processing said plates to obtain the desired image, one uses developers containing aggressive chemical products and high pH (higher than 12) or organic solvents associated to surfactants.

There are on the market plates sensitive to radiation ranging from 405 to 410 nm of the radiation spectrum, according to patent application EP1349006 and U.S. Pat. No. 7,955,776, but, in order to obtain the desired image in processing said plates, one employs alkaline developers (pH>13) including a preliminary treatment step comprising washing with water to remove the second protective layer, thus enabling the adequate action of the developer to solubilize the non-exposed areas.

As other examples of printing plates that use, as a developer, an alkaline solution, there are those contained in the Brazilian patent applications PI0400607-0 and PI0109106-9.

Patent application PI0400607-0 discloses a photosensitive composition exhibiting enhanced sensitivity, comprising an ethylenically unsaturated monomer, a photopolymerization initiator composition and a polymer binder. A lithographic printing plate is also disclosed, which comprises the photosensitive composition cited before on a support having a hydrophilic surface. The disclosure of the printing plate is carried out by using an aqueous alkaline developing solution that exhibits preferably a pH of 8.5 to 12.5.

Patent application PI0109106-9 discloses a photosensitive composition that can be applied to photosensitive planographic printing plates and to photoresistant materials. More particularly, the present document refers to a photosensitive composition that provides a coating film having excellent resistance to solvents and wear resistance, and to a photosensitive planographic printing plate having excellent resistance to solvent and the useful life of the printer that uses it. The present document cites, as an example of developer for developing said planographic printing plate, an alkaline aqueous solution (basic aqueous solution).

Therefore, it becomes necessary to develop layers sensitive to radiation in regions of the electromagnetic spectrum applied to aluminum substrates for offset printing, wherein the image-forming process uses ecologically adequate or correct products, known on the market as washing and protecting solution, thus preventing the user of the printing plate to have financial expenditures with the adequate disposal of the chemical products used in processing the plates, be they analog, digital or photopolymer, which are usually toxic and corrosive.

SUMMARY

The present invention refers to composition sensitive to radiation in electromagnetic spectrum ranges for printing purposes comprising:
(a) one or more of a binding polymer;
(b) an ethylenically unsaturated compound;
(c) one or more compounds capable of forming free radicals in the selected region of the spectrum;
(d) a sensitizer;
(e) optionally, a photoaccelarator;
(f) an adhesion promoter;
(g) a dye; and
(h) optionally, thermal polymerization inhibitors.

Another embodiment of the present invention refers to printing plates comprising:
(1) a duly treated hydrophilic aluminum substrate;
(2) a first layer sensitive to Ultraviolet, Violet, or Infrared radiations of the electromagnetic radiation spectrum composed of the photosensitive composition described above, applied on the aluminum substrate; and (3) a second layer applied on the first one, impermeable to air oxygen.

Another embodiment of the present invention refers to the use of the photosensitive composition described above in the preparation of a printing plate.

Another embodiment of the present invention refers to an image developing process comprising:
(i) preparing a printing plate as described above;
(ii) exposing the plate obtained in step (i) to ultraviolet, violet or infrared radiation,
(iii) developing the plate obtained in step (ii) with an aqueous developing composition suitable and correct from the environmental point of view, and
(iv) drying the plate obtained in step (iii) to form a protective film on the plate surface.

DETAILED DESCRIPTION

The present invention has the objective of developing plates that enable one to use chemical products having neutral pH and that are biodegradable in the image-forming process, so that the users of said plates will comply with the provisions of Rule ISO 14.001 with appropriate discard of the processing materials. The developed plates guarantee the balance of the environment and the continuous improvement of the life quality.

In addition to the advantages related to the ecologic aspects, the process of copying the ecologically adequate or correct plates of the present invention is more simplified, since the printing shops do not have to control the developer temperature, the conductivity or merely do not process the plate in processing machines, thus generating a smaller number of variables in the process, while saving electric energy and time.

The products used as developers (ecologically correct products) of the plates of the present invention are based on surfactant compounds and salts of biodegradable organic acids and have low concentration in the developing solution used.

The objective of the present invention is to obtain a sensitive composition in the Ultraviolet, Violet and Infrared range of the radiation spectrum, containing a binder capable of binding the other components of the composition such as ethylenically unsaturated compounds, a polymerization starting system via free radicals, a sensitizer, a photoaccelerator and an adhesion promoter. The composition is applied to an aluminum substrate in liquid form, by dissolving the components in organic solvents and dried in a condition suitable to form a film on the substrate. This film, when exposed to radiations in the Ultraviolet, Violet and Infrared range of the electromagnetic radiation spectrum, becomes insoluble in aqueous solutions that are ecologically adequate or correct from the environmental point of view. Since the solubility of the non-exposed area is preserved, it is easily removed by the ecologically correct aqueous developing solution having a pH of 6 to 8, thus dispensing the washing with water prior to development and remaining on the substrate while the desired image in the printing process is coated by the protective film formed by the polymer existing in the developing solution.

The composition of the present invention containing a binder and other components is usually subjected to radiation of laser-ray emitting diodes.

Infrared emitting sources containing lasers emitting in the close infrared region, in the wavelength range from 800 to 1100 nm, can be employed to form the image on the plate. The preferred emitting lasers are those capable of emitting in the wavelength range between 830 nm and 1060 nm. The exposure energy densities used at present range from 60 to 200 mJ/cm$^2$, preferably from 80 to 120 mJ/cm$^2$, depending on the sensitiveness of the thermo-sensitive layer. The devices that exist on the market to form image are Screen PlateRite 4300 or 8600 manufactured by Screen, Chicago.

Lasers emitting in the visible region of the radiation spectrum, emitting in the region from 390 to 600 nm, may also be employed to form image on the plate. At present, lasers emitting in the violet region of the spectrum, about 410 nm, are being employed, and the exposure energy densities range from 5 to 100 mJ/cm$^2$, depending on the sensitiveness of the photosensitive layer.

As examples devices that emit violet and ultraviolet radiations we cite those manufactured by Xanté Corporation, Alabama, USA and Micra Platesetter manufactured by Screen (Japan).

Lasers emitting radiations in the spectrum range from 200 to 390 nm may also be employed. The preferred ones are ultraviolet and ultraviolet diode lasers (LEDs) having wavelength from 350 to 390 nm.

When plates containing such compositions are processed in an ecologically adequate or correct aqueous developing solution, they provide the formation of an oleophilic plastic film with excellent adherence to the duly treated aluminum substrate, exhibiting high resistance to the chemical products used in the offset graphic printing process and high resistance to abrasion, providing a high number of printed copies. The image area formed has oleophilic characteristic, therefore, it attracts the printing ink, whereas the non-image area attracts water, expelling the ink, because it has hydrophilic characteristic.

The printing plate according to the present invention is composed of:
(1) a duly treated hydrophilic aluminum substrate;
(2) a first layer sensitive to radiations in the Ultraviolet, Violet and Infrared range of the electromagnetic radiation spectrum, applied on the substrate comprising the following composition:
  (a) one or more binding polymer;
  (b) an ethylenically unsaturated compound;
  (c) one or more compounds capable of forming free radicals in the region of the selected spectrum;
  (d) a sensitizer;
  (e) optionally, a photoaccelerator;
  (f) an adhesion promoter;
  (g) a dye;
  (h) optionally, thermal polymerization inhibitors, and
(3) a second layer applied on the first one, which is impermeable to air oxygen.

Treatment of the Hydrophilic Aluminum Substrate

The treatment usually employed is as follows:
  degreasing and deoxidizing the aluminum surface by the action of an alkaline substance, wherein one usually employs a 2% sodium hydroxide solution at the temperature of 60° C.;
  then, the aluminum surface is subjected to an electrochemical treatment that alters the surface morphology, enlarging its area. Usually, one employs a solution of 10 to 15 g/L of hydrochloric acid at a temperature ranging from 30 to 40° C. containing Al ions. The treatment time is of about 20 seconds with a current density of 60 A/dm$^2$.
  with a view to enhance the resistance of the surface, the aluminum is subjected to anodization treatment for 15 seconds, by immersion in a 15% $H_2SO_4$ solution at a temperature of 35 to 45° C. with a current density of 25 $A/dm^2$;

after washing with deionized water, one treats the aluminum surface with a 0.2% solution of polyvinyl phosphonic acid at a temperature of 70° C.

First Layer Sensitive to Radiations in the Ultraviolet, Violet and Infrared Range of the Electromagnetic Radiation Spectrum The first photosensitive layer is applied to the aluminum substrate (duly treated, as exposed above) in the form of solution, wherein all the components should be soluble. As examples of solvents that may be employed, one cites the glycol esters (ethylene glycol monoethyl ether, propylene glycol monomethyl ether, methyl ethyl ketone, methyl isobutyl ketone, tetrahydrofuran, butyl acetate, among others. Depending on the mixture of solvents used, the first photosensitive layer is dried at temperatures of up to 110° C. The dried film should weight approximately from 0.5 $g/m^2$ to 1.5 $g/m^2$.

The percentages of each component of the first photosensitive layer with respect to the total weight of the composition are as follows:

(a) binding polymer—10 to 40% by weight in the solution

As examples of binding polymers, one cites polyvinyl acetal polymers, acrylic polymers and preferably mixtures thereof.

Polyvinyl acetal polymers are used as binders in photosensitive compositions, mainly those used in conventional negative plates for offset printing, because they are good film formers, have good resistance to chemical attack and good physical properties. Another advantage is the fact that they are oleophilic, attracting the printing ink in the image area. However, the proposed compositions that use these polyvinyl acetals, even if they contain hydroxyls or carboxyls in the acetal unit, since they are not easily soluble in aqueous solutions, they need a determined percentage of solvent in the composition of the developing solution, which, in general, has pH higher than 9, which makes the use thereof as a binder unfeasible in compositions that can be processed with ecologically correct solutions.

These polyvinyl acetal polymers used before are described in patent applications U.S. Pat. No. 4,665,124, U.S. Pat. No. 4,940,646, U.S. Pat. No. 5,169,898, U.S. Pat. No. 5,169,897 and U.S. Pat. No. 5,700,619.

Polyvinyl acetal is obtained by the reaction of an aldehyde with a polyvinyl alcohol polymer. Polyvinyl alcohol is obtained by hydrolysis of vinyl ester polymers, preferably obtained from vinyl acetate, since vinyl alcohol is non-existent. The saponification degree is the degree of molar hydrolysis, regardless of the process used for the hydrolysis. Pure polyvinyl alcohol has, for instance, a saponification degree of 100% mol, but in commercial products one can find a saponification degree of from 88 to 98 mol %.

Commercially, polyvinyl alcohol is found on the market under the name Mowiol, manufactured by Kuraray America, Inc. and Celvol, manufactured by Celanese Chemicals. The identification of the types of polymer has 2 number associated, the first one indicating the value of viscosity of an aqueous solution of the 4% polymer at a temperature of 20° C., expressed in MPa·s, and the second one indicating the saponification degree.

The usually employed aldehydes are acetaldehyde, propionaldehyde, butyraldehyde, valeraldehyde, hydroxybenzaldehyde, vanylin, formylphenoxyacetic acid, among others.

The synthesis of polyvinyl acetals is widely known and usually made in the presence of a strong inorganic or organic acid. One may use hydrochloric acid, sulfuric acid or sulfonic p-toluene. The concentration of the acid should be the one required for enabling protonation to occur, without causing undesirable hydrolysis of the final product. In general, one employs, as reaction medium, aprotic di-polar organic solvents like N methyl pirrolidone or dimethylsulfoxide. Mixtures of water with alcohols may also be employed, particularly mixtures between water and propanol, water and methanol, and water and ethanol.

The temperature of the reaction depends on the type of aldehyde, the desired level of substitution and the solvent employed. The preferred range is from 50 to 60° C.

The desired polyvinyl acetal is separated from the reaction medium by adding water containing sodium bicarbonate or sodium carbonate at a concentration required to adjust the pH at about 7, strong stirring, and then filtered and dried, preferably, under vacuum at a low temperature.

Among the binding acrylic polymers employed in the present invention are copolymers or terpolymers containing units of acrylic acid, methacrylic acid, hydroxyl alkyl methacrylates, alkyl methacrylate, alkenyl methacrylates, aryl acrylates, alkylaryl methacrylates, acrylonitryl, acrylamide, methacrylamide, N-methoxymethacrylamide, esters of acrylic acid or methacrylic acid with polyethyleneglycol or polypropyleneglycol, styrene and substituted styrenes. Binding polymers containing hydroxyalkylmethacrylates may be esterified with anhydrides such as maleic, crotonic anhydride etc., as well as esterified with acid chlorides like acryloyl chloride, methacryloyl chloride, cinamoyl chloride, and others. These polymers can be obtained by usual polymerization techniques, the preferred molecular weight ranging from 10,000 to 120,000.

One of the objectives of the present invention is to provide a film capable of being processed in ecologically adequate or correct solutions, having good oleophily and resistance to abrasion during the printing process by the use of polyvinyl acetal polymers and acrylic copolymers or terpolymers capable of binding the other constituents of the composition sensitive to radiations. The ratio between the polyvinyl acetal and the acrylic polymer may range from 3:1 to 1:3.

(b) Ethylenically unsaturated compound—10 to 60% by weight in the solution

The ethylenically unsaturated compounds are monomers or oligomers having at least one terminal ethylenic group and that can polymerize by the action of free radicals obtained during exposure of the initiators to radiation.

Examples of monomers or oligomers are monomers of multifunctional esters of acrylic acid or of methacrylic acid with ethylene glycol, or trimethylolpropane, or pentaeritritol, or ethoxylated ethylene glycol, or ethoxylated trimethylolpropane, multifunctional esters of urethane with acrylic acid or metharylic acid, epoxylated esters of acrylic acid or of methacrylic acid and amine oligomeric diacrylates.

The compounds containing preferred polymerizable radicals are pentaeritritol tetraacrylate, pentaeritritol methacrylate, dipentaeritritol pentaacrylate, dipentaeritritol pentacrylate di(metylol propane)tetracrylate, di(methylol propane) tetramethacrylate, diethylene glycol diacrylate, diethyleneglycol dimethacrylate and oligomers of urethane acrylates and urethane methacrylates containing in the chain units of propylene diglycol.

(c) Free radicals forming compound—0.05 to 20% by weight in the solution

The free radicals forming compound should be selected so as to absorb considerably in the spectrum range of the desired radiation emitting source.

Said compounds should be capable of forming free radicals when exposed in the desired region of the spectrum, and may be used either alone or in combination with others to increase the effectiveness of the polymerization.

Examples of free radicals forming compounds are the following acetophenone derivatives (2,2-dimethyl-2-phenylacetophenone and 2-methyl-1-[4-(methylthyo)phenyl]-2-morpholino propan-1-one), benzophenone, benzyl, keto cumarins (3-benzoyl-7-methoxy cumarin), substituted alkyl antraquinones, xanthone and thioxantone.

A preferred class of free radicals forming compounds is that of titanocenes. Examples for such compounds are: dicyclopentadienyl-Ti dichloride, dicyclopentadienyl-Ti-bisphenyl, dicyclopentadienyl-Ti-bis-2,3,5,6-tetrafluorofen-1-yl, dicyclopentadienyl-Ti-bis-2,4,6-tetrafluorofen-yl, dicyclopentadienyl-Ti-bis-2,6-difluorofen-1-yl, dicyclopentadienyl-Ti-bis-2,4-difluorofen-1-yl, dimethylcyclopentadienyl-Ti-2,3,4,5,6,15-pentafluorofen-1-yl and dimethylcyclopentadienyl-Ti-2,6-15 difluorofen-1-yl.

Another class of compounds is that of hexaarylbiimidazols. Examples thereof are: 2,2'-bis(o-chlorophenyl)-4,4',5,5'-tetra(p-fluorophenyl)biimidazol, 2,2'-bis(o-chlorophenyl)-4,4',5,5'-tetra(p-chlorophenyl)biimidazol, 2,2'-bis(o-chlorophenyl)-4,4',5,5'-tetra(o-chlorophenyl)biimidazol, 2,2'-bis(o-chlorophenyl)-4,4',5,5'-tetra(o,p-dichlorophenyl) biimidazol, and 2,2'-bis(o-chlorophenyl)-4,4',5,5'-tetra(o,p-dibromophenyl)biimidazol.

The triazines substituted with holomethyl may also be employed. Examples are: 2,4-bis(trichloromethyl)-6-(p-methoxy-styryl)-s-triazine, 2,4-bis(trichloromethyl)-6-(4-methoxy-napht-1-yl)-s-triazine, 2,4-bis(trichloromethyl)-6-piperonyl-s-trizine and other s-triazines described in patent applications U.S. Pat. No. 6,037,098 and U.S. Pat. No. 6,010,824.

Another group of compounds employed as photoinitiators are the salts of onium. Among the existing classes of compounds, the more useful ones are of iodonium and sulfonium. Specific examples are diphenyl iodonium chloride, diphenyl iodonium hexafluorophospate, triarylsulfonium hexafluoroantimonate, triarylsulfonium hexafluorophosphate, triarylsulfonium p-toluenosulphonate and salts of onium described in patents U.S. Pat. No. 5,955,238 and U.S. Pat. No. 6,037,098.

The preferred onium salts are salts of diaryliodonium and salts of triarylsulphonium.

Another class of initiators are borate salts such as triphenyl tetrabutylamonium (n-butyl)borate, diphenylodonium tetraphenylborate, tetraethylamonium triphenyl(n-butyl)borate, triphenylsulfonium triphenyl(n-butyl)borate and others described in patents U.S. Pat. No. 6,232,038 and U.S. Pat. No. 6,218,076.

Onium salts, borate salts and s-triazines are the preferred free radical initiators for compositions sensitive in the wavelength range from 700 to 1200 nm of the radiation spectrum.

(d) Sensitizer—0.02 to 10% by weight in the solution

With a view to enhance the sensitivity of the initiating system, one adds to the composition compounds capable of transmitting the energy absorbed from a laser beam to an initiator by energy transfer or electron transfer, and one should choose them in accordance with the wavelength of the laser used for exposure.

The compounds that act as sensitizers used in the layers that are photosensitive to radiations in the region of the ultraviolet and violet spectrum should absorb in the wavelength from 200 to 600 nm. As example of sensitizers for this violet region of the spectrum, the following are cited: cyanin dyes, rodamin compounds, rhodanine, compounds such as ethyl 4-dimethylaminobenzoate and dialkylaminobenzene, dialkylaminobenzophenone compounds such as 4,4'-bis(dimethylamino)benzophenone, 4,4'-bis(diethylamino)benzophenone, 2-(p-dimethylaminophenyl)benzoxazol, 2-(p-diethylaminophenyl)benzoxazol, 2-(p-dimethylaminophenyl)benzo[6,7]benzoxazol, 2,5-bis(p-dimethylaminophenyl)1,3,4-oxadiazol, 2-phenyl-4-(2-chlorophenyl)-5-(4-N,N-diethylaminophenyl)oxazol-1,3,2-(p-diethylaminophenyl) benzimidazol, 2,5-bis(p-diethylaminophenyl)1,3,4-thiodiazol, (p-dimethylaminophenyl)pyridine, 2-(p-dimethylaminophenyl)quinoline, 2(p-dimethylaminophenyl)pyrimidine, cumarin compounds such as 3-benzoyl-7-methoxy-cumarin and 7-methoxy-cumarin, thioxanthene compounds such as 2-isopropyl thioxanthenone, xanthenes and pyrenes.

Other types of compounds that may be used as sensitizers are cited in patent application EP1349006 such as the stilbenes, bis-stirylbenzenes, divinylstilbenes, triazinylaminostilbenes, furanes, benzofuranes, stilbenylnaphthotriazols, bis-triazolstilbenes, benzoxazols, bisphenylbenzoxazols, stilbenylbenzoxazols, diphenyloxadiazol and naphthalimides. These compounds are optical bleachers and are commonly known as Uvitex OB and manufactured by Ciba Specialty Chemicals, Basel, Switzerland. These compounds are capable of absorbing light in the wavelength from 300 to 450 nm and of emitting energy absorbed in the range from 400 to 500 nm in the form of fluorescent light.

The sensitizers usually employed in the layers sensitive to radiations in the close infrared region in the wavelength from 700 to 1200 nm are dyes. These dyes are defined in various patent applications, for example, in U.S. Pat. No. 5,705,309, U.S. Pat. No. 5,858,604, U.S. Pat. No. 6,017,677 and U.S. Pat. No. 6,022,668. The preferred dyes are those derived from classes that include, but are not restricted to squarilium, phthalocyanin, indocyanin, cyanin (including polymetin), merocyanin, indolizin, pyrilium, calcogenpyrilo-arylidene.

The photosensitive layers may contain one or more infrared absorbing dyes, even of different wavelengths. A printing plate containing dyes of different wavelengths provides the advantage of being used on different image forming devices existing on the market.

In a thermosensitive composition a dye or pigment absorbs infrared radiation emitted by laser within a required range and returns it in the form of heat, which is used in thermal decomposition of the polymerization initiator by transferring this thermal charge.

(e) Photoaccelerator—0.01 to 2% by weight in the solution

In order to obtain high sensitivity, it is advantageous to add to the photopolymerizable composition a photoaccelerator containing, as a radical, a chain transfer agent. As preferred chain transfer agents there are compounds containing sulfur, especially thiols like 2-mercaptobenzothiazol, 2-mercaptobenzoxazol and 2-mercaptobenzimidazol.

(f) Adhesion promoter—0.01 to 5% by weight in the solution

The adhesion promoter is added with a view to increase the anchorage of the layer on the aluminum surface and thereby to increase the number of prints of the plate.

The adhesion promoter may be used as follows:
  as one of the compounds of the photosensitive layer;
  applied in isolation in the treated aluminum surface in the form of a solution and then dried; or
  as a reactant in the synthesis of the copolymer employed as binder.

As preferred adhesion promoters there are the phosphates esters of polyethylene glycol methacrylates, commercially known as Blemmer PE and manufactured by NOF Corporation, CA, EUA, and Sipomer PAM, manufactured by Rhodia, NJ, EUA.

The adhesion promoter may be considered a monomer and participate in the synthesis of the binding polymer in the photosensitive layer by reaction of the double bond of the reactive unit of the methacrylate with the monomers or oligomers belonging to the composition, while being chemically bonded to the metallic substrate by the active phosphate groups.

(g) Dye—0.1 to 10% by weight in the solution

Dyes are used in the photosensitive composition of the present invention to achieve contrast between the non-image area and the image-area, so that the user to view, previously, the work that will be printed.

The dyes are practically insoluble in the solvents used in the compositions; therefore, before being added to the photosensitive composition, they should be previously dispersed in a solution containing a part of the binding polymer as a dispersant and a part of the solvent that will be used in the composition. In order to facilitate the incorporation of the dye into the solvent, one employs a dispersing agent. As dispersing agents, one may use Solsperse and Disperbik, manufactured by Lubrizol, Ohio, USA, and BYK-Chemie GmbH, Germany, respectively.

The solution containing the solvent, the dye, the dispersing polymer and the dispersing agent is placed in a high-speed dispersing device containing discs or blades for the purpose of reducing the particle size of the dyes, making them quite fine. One may also employ sphere mills or cylinder mils such as those employed in the manufacture of inks. During the dispersion or grinding, the ratio between the dye and the dispersing polymer may range from 1:1 to 1:5, and the solid contents of the dispersion ranges from 10 to 20%, preferably using, as a solvent, the same one that is used in greater amount in the photosensitive coating solution. The dispersing agent is used in the range from 0.01 to 0.5% by weight in the solution. The most widely used types of dyes are those of phthalocyanin blue of trade name Heliogen Blue, manufactured by BASF in Brazil, preferably the one that is free from copper, called Heliogen Blue L 7460.

Commercially, we can find preparations of dyes dispersed in polymer in the form of powder and which may be added directly to the photosensitive composition. We cite, as an example, a blue dye preparation in polyvinyl butyral, containing 50% dye, called Renol Blue B2G HW30, manufactured by Clariant, Germany.

(h) Thermal polymerization inhibitors—0.01 to 2% by weight in the solution

The composition may contain small amounts of thermal polymerization inhibitors to prevent undesirable polymerizations in the phase of drying the layer during the production, in the transportation or in the storage of the product. As examples, there are: hydroquinone, p-methoxyphenol, 2,6-di-butyl-p-cresol and butyl catechol.

Second Protective Transparent Layer

The polymerization via free radicals is sensitive to oxygen and this second protective transparent layer prevents contact of the first photopolymerizable layer with air. This protective layer should be transparent to radiation, homogeneous, sufficiently impermeable to oxygen and soluble in water.

The protective layer contains polyvinyl alcohol, preferably a mixture of at least 2 types, so as to obtain an average saponification degree of approximately 92 mol %.

The thickness of the protective layer to be applied should be of 0.2 g/m$^2$ to 2.5 g/m$^2$, based on the dry layer.

It is formed in the surface of the aluminum plate containing the above-described composition, after being exposed to radiation and after being subjected to a developing aqueous solution to remove the non-exposed water, and when dried, a protective film until the plate is mounted on the printing machine.

Processing of the Plate of the Present Invention

The method of processing the plate of the present invention may be made manually by immersing and stirring the plate in a container containing the washing and protective solution, either manually or automatically, using an automatic processing device, the processing time being defined as being the time sufficient for total removal and cleaning of the non-image area.

Generally, the washing and protective solution contains a surfactant, a protective polymer, a preserver, salts for restoring the hydrophily of the aluminum surface, its pH being adjusted at about 7.

The surfactants that may be employed in the washing solution may be anionic, non-ionic or mixture thereof, at a concentration sufficient to obtain a surface tension of about 60 mN/m.

As examples of anionic surfactants, there are alkylbenzenesulphonates, alkylnaphthalenesulphonates, n-alkylsulfosuccinates and alkyldiphenyloxide disulphate salts. The preferred ones are sodium dodecylbenzenesulphonate, sodium methylenedinaphthenesulphonate and sodium dioctylsulphosuccinate. Commercially, they are found as Rhodacal DSB, manufactured by Rhodia SA, Maranil DB-50, manufactured by Cognis, Brazil, Lankropol 4500, manufactured by Akzo Nobel, Brazil.

Among the non-ionic surfactants, one may use ethoxylated alkyl phenol, commercially found as Triton X100, manufactured by Down Chemical Corporation, USA, and Witconol NP-100, manufactured by Akzo Nobel, Brazil.

One employs, as preservers, bactericidal compounds that prevent attack on the solution components by microorganism. We cite, as examples, those commercially found as Bioban BP Plus, manufactured by Dow Chemical, USA, or Acticide LA 1206, manufactured by Thor Specialities, USA.

The protective polymers that may be employed as film formers for protection of the plate are gum Arabic, carboxymethyl cellulose, dextrin, poly(vinyl alcohol) and poly (vinyl pirrolidone), in an amount that may range from 1 to 3% by weight in the solution.

Addition of organic or inorganic acids associated to organic or inorganic salts to the developing solution is necessary for restoring the hydrophily of the surface, as well as for keeping the pH at about 7. Among the organic acids, there are carboxylic, sulfonic and phosphonic acids, as well as the salts thereof. As to inorganic acids, there are hydrochloric acid, sulfuric acid, phosphoric acid and nitric acid, as well as the salts thereof. The amount employed should not exceed 2% by weight in the solution.

If necessary, one may add wetting agents to the solution with a view to facilitate the removal thereof in the printing machine. One may add, for this purpose, glycol derivatives (triethyleneglycol, ethylene glycol, etc.) glycerin and sorbitol.

EXAMPLES

The examples given hereinafter are preferred and illustrative variations of the present invention and should not be taken as being limitations thereof. In this regard, one should understand that the scope of the present invention embraces other possible variations, being limited only by the contents of the accompanying claims, which include the possible equivalents.

Example of a Plate Cleaning and Protective Solution:

| Components | weight % |
|---|---|
| Demineralized water | 80.19 |
| Potassium citrate | 7.0 |
| Rhodacal DSB | 6.0 |
| Dextrin | 3.0 |
| Bioban BP Plus | 0.16 |

Examples of Obtainment of Binding Polymers

Example 1: Obtainment of Polyvinyl Acetal

In a glass reactor with 3 mouths, equipped with addition funnel, reflux condenser, thermometer, mechanical stirring and heating, one added 50 g of polyvinyl alcohol (12% acetate groups and with molecular weight of about 27000), dissolved in 200 ml of dimethylsulfoxide, and raised the temperature up to 90° C., keeping this temperature for 4 hours until total solubilization of the polyvinyl alcohol.

The temperature of the solution was lowered to 60° C., and one added slowly a solution of 2.0 g sulfuric acid concentrate at 20 ml of sulfoxide dimethyl.

Then a solution containing 12 g salicylaldehyde, 25 g of 4-carboxybenzaldehyde and 100 ml of dimethylsulfoxide, was added for 30 minutes, which remained under stirring at the same temperature for 3 more hours. The mixture was cooled to a temperature of 50° C., and one added, for half an hour, 10 g propionaldehyde, keeping the reaction for 3 more hours. After this time, the water formed in the reaction mixture was removed by distillation under reduced pressure, and the mixture was neutralized with sodium carbonate solution until pH 7.

The polymer was precipitated by pouring the reaction mass into 3 liters of water under strong stirring.

After filtration, the product was washed in water, filtered and dried under vacuum at a temperature of 45° C. 75.2 g of polymer with acidity index of about 110 mg of KOH/g was obtained, the yield of the reaction being of 92.3%.

Example 2: Obtainment of Acrylic Polymer

A mixture of monomers containing 54 g of methylmethacrylate, 5 g of methacrylic acid, 40 g of CD552, 1 g of Sipomer PAM 100, 0.25 g of n-dodecylmercaptane and 0.6 g of Vazo 67 (polymerization initiator manufactured by Du Pont) was put into an addition funnel.

In a 1-liter glass reactor with 4 mouths, equipped with stirrer, reflux condenser, addition funnel, thermometer and inlet for nitrogen, one put 400 mL of methyl ethyl ketone. In a nitrogen-inert environment, one added, under stirring, the fourth part of the above mixture of monomers, and raised the temperature to 80° C. The reaction was kept in these conditions for 1 hour and then the remaining of the monomer mixture contained in the addition funnel was slowly added for 90 minutes. Then 12 additions of 0.06 g of Vazo 67 were made, with 1-hour intervals, and the reaction continued for 90 more minutes in the same conditions.

The reaction mixture was cooled to a temperature of 25° C. The conversion in polymer was of 97%, with molecular weight of about 40,000 and acid number of 97 mg of KOH/g. The solid content of the solution was adjusted to 10% with addition of the solvent methyl ethyl ketone.

Examples of Coating Solutions Photosensitive for Various Radiation Ranges:

|  | UV Sensitive composition 365 nm (g) | | | V Sensitive composition 405 nm (g) | | | IR Sensitive composition 830 nm (g) | | |
|---|---|---|---|---|---|---|---|---|---|
|  | 1 | 2 | 3 | 4 | 5 | 6 | 7 | 8 | 9 |
| Dowanol PM | 60 | 60 | 60 | 60 | 60 | 60 | 60 | 60 | 60 |
| Methyl Ethyl Ketone | 40 | 40 | 40 | 40 | 40 | 40 | 40 | 40 | 40 |
| Polymer of Ex. 1 |  | 1.5 | 1.0 |  | 1.5 | 1 |  | 1.5 | 1.0 |
| Polymer of Ex. 2 (*) | 25 |  | 20 | 23 |  | 20 | 25 |  | 20 |
| SR399 | 4.2 | 3.0 | 4.2 | 4.2 | 3 | 1.5 | 4.2 | 3 | 4.2 |
| CN9101 |  | 1.0 |  |  | 1 | 4.5 |  | 1 |  |
| Triazin P | 0.05 | 0.05 | 0.05 |  |  |  |  |  |  |
| VPOXA |  |  |  | 0.7317 | 0.7317 | 0.7317 |  |  |  |
| HABI |  |  |  | 1.2 | 1.2 | 1.2 |  |  |  |
| Irgacure 250 | 0.45 | 0.45 | 0.45 |  |  |  | 0.45 | 0.45 | 0.45 |
| Dye S0507 |  |  |  |  |  |  | 0.224 | 0.224 | 0.224 |
| Renol Blue | 0.75 | 0.75 | 0.75 | 0.5 | 0.5 | 0.5 | 0.75 | 0.75 | 0.75 |
| Hostanox 03 |  |  |  | 0.0043 | 0.0043 | 0.0043 |  |  |  |
| 2-mercaptobenzothiazol |  |  |  | 0.1562 | 0.1562 | 0.1562 |  |  |  |
| Blemmer PE |  |  |  |  | 0.2 | 0.2 |  |  | 0.2 |

(*) 10% by weight of polymer in the solution
UV—ultraviolet
V—violet
IR—infrared
Dowanol PM—polyethylene glycol ether, manufactured by Dow Chemical
SR 399—Dipentaeritritol Pentaacrylate, supplied by Sartomer Inc., USA
CN9101—Urethane Acrylate oligomer, supplied by Sartomer Inc., USA
Triazin P—2.4-bis(trichloromethy)-6-piperonyl-s-triazin, manufactured by PCAS, France
VPOXA—2-phenyl-4-(2-chlorophenyl)-5-(4-N,N-diethylaminophenyl)oxazol-1,3, manufactured by AZ Eletronic Material, Germany
HABI—1H-Imidazol, 2(2-chlorophenyl)-1[2-(2-chlorophenyl)-4,5-diphenyl-2H-imidazol-2-yl]-4,5-diphenyl
Irgacure 250—(4-methylphenyl)[4-(2-methylpropyl)phenyl] - iodonium, hexafluorophosphate (1-), manufactured by CIBA Specialty Chemicals
Dye S0507—a cyanin dye sensitive in the region of the spectrum from 790 to 819 nm, manufactured by FEW Chemicals GmbH, Germany
Renol Blue—dye dispersion based on pththalocyanin, manufactured by Clariant Corporation, USA
Hostanox 03—ethynele bis[3,3-bis(3-terc-butyl-4-hydroxyphenyl)butyrate] -antioxidant
2-Mercaptobenzothiazol—supplied by Sigma Aldrich, St. Louis, USA
Blemmer PE—polyethylene glycol monomethacrylate phosphate, supplied by NOF Corporation, Tokyo, Japan To aluminum plates in the format 200 cm×615 cm, duly electrogranitized, anodized and treated with phosphonic polyvinyl acid, one applied, with usual techniques, respectively, the photosensitive solutions of the first layer, exemplified above, all the plates being subjected to the drying process for evaporation of solvents at a temperature of 100° C. for 1 minute. Subsequently, on the dry film of the first layer of these plates, one applied an aqueous polyvinyl alcohol solution, which was also dried at a temperature of 100° C. for 1 minute. Both the solution of the first layer and the solution of the second layer were applied by conventional coating processes, so as to obtain the desired grammage according to the type of region of the spectrum. The grammage of the dried layers were as follows:

|  | Grammage (g/m$^2$) | | | | | | | | |
|---|---|---|---|---|---|---|---|---|---|
| Example | 1 | 2 | 3 | 4 | 5 | 6 | 7 | 8 | 9 |
| First layer | 1 | 1 | 1 | 1.5 | 1.5 | 1.5 | 1 | 1 | 1 |
| Second layer | 0.5 | 0.5 | 0.5 | 2.2 | 2.2 | 2.2 | 0.5 | 0.5 | 0.5 |

With the objective of forming image for enabling the analysis of the reproduction of the photosensitive film and its resistance to the printing process, the plates referring to the above examples were placed in the respective image forming devices, according to their absorption wavelength, that is, plates 1, 2 and 3 subjected to the Basys Print device with UV-rays emitting lamps with wavelength of 365 nm, with energy density of about 80 mJ/cm$^2$; plates 4, 5, and 6 were placed on a device containing diodes emitting in the violet region 405 nm, Micra Platesetter Screen, which was adjusted to energy density of 50 μm/cm$^2$ and plates 7, 8 and 9 were placed on a device containing infrared lasers of 810 nm, Screen Plate Rite 4300, with exposure energy density of 170 mJ/cm$^2$.

One created, on all devices, the possibility of forming a point scale ranging from 1% to 99%, with 175 points per inch, which reproduces all the total image passes. The regions chosen for the analysis of the image points formed were the intervals of 1 to 3%, of 97 to 99%, as well as the points of 50% which represent the half-ton areas.

The plates exposed to ultraviolet and infrared radiations were processed with the washing and protective solution, but the plates that were exposed to violet radiation were subjected to a thermal treatment during 1 minute at a temperature of 110° C. before being processed in said solution.

The results achieved in the measurements of points formed, with the help of a point measurer of Teckon mark, were as follows:

|  | Ultraviolet plate | | | Violet plate | | | Thermal plate | | |
|---|---|---|---|---|---|---|---|---|---|
| Target | 1 | 2 | 3 | 4 | 5 | 6 | 7 | 8 | 9 |
| 1% | 0.00% | 0.00% | 1.30% | 0.00% | 0.00% | 1.00% | 0.00% | 0.90% | 1.10% |
| 2% | 2.40% | 2.30% | 2.50% | 1.00% | 1.15% | 1.90% | 1.80% | 1.90% | 2.30% |
| 3% | 3.40% | 3.50% | 3.55% | 2.50% | 2.50% | 3.10% | 2.80% | 2.90% | 3.00% |
| 50% | 58.00% | 58.50% | 59.00% | 61.00% | 62.50% | 65.00% | 55.00% | 56.00% | 56.50% |
| 97% | 100.00% | 100.00% | 97.50% | 98.00% | 98.10% | 97.90% | 100.00% | 100.00% | 97.00% |
| 98% | 100.00% | 100.00% | 98.90% | 100.00% | 100.00% | 98.30% | 100.00% | 100.00% | 98.70% |
| 99% | 100.00% | 100.00% | 99.00% | 100.00% | 100.00% | 99.50% | 100.00% | 100.00% | 100.00% |

The plates were placed on Heidelber printing machine, model SORM-Z, to evaluate the resistance of the coating during the printing process, the point measurements of which on the plate, after 30,000 copies, are shown in the table below:

|  | Ultraviolet plate | | | Violet plate | | | Thermal plate | | |
|---|---|---|---|---|---|---|---|---|---|
| Target | 1 | 2 | 3 | 4 | 5 | 6 | 7 | 8 | 9 |
| 1% | 0.00% | 0.00% | 1.20% | 0.00% | 0.00% | 0.90% | 0.00% | 0.80% | 1.05% |
| 2% | 2.20% | 2.00% | 2.40% | 0.80% | 1.10% | 1.80% | 1.50% | 1.60% | 2.20% |
| 3% | 3.10% | 3.30% | 3.40% | 2.40% | 2.35% | 3.00% | 2.70% | 2.80% | 2.95% |
| 50% | 56.00% | 56.50% | 58.00% | 60.40% | 61.00% | 64.00% | 54.50% | 55.40% | 56.50% |
| 97% | 100.00% | 100.00% | 97.00% | 96.60% | 97.20% | 96.80% | 100.00% | 100.00% | 97.00% |
| 98% | 100.00% | 100.00% | 98.00% | 100.00% | 100.00% | 98.20% | 100.00% | 100.00% | 98.50% |
| 99% | 100.00% | 100.00% | 99.00% | 100.00% | 100.00% | 99.40% | 100.00% | 100.00% | 100.00% |

In the above table, the results exhibited by the printing plates containing compositions 1, 2, 4, 5, 7 and 8 demonstrated unsatisfactory results in terms of resolution, but they can be adjusted by means of software R.I.P. (Raster Image Processor) to a resolution of 1 to 99%.

According to the results presented above, we can conclude that all the photosensitive layers can be used in manufacturing ecologically correct pre-sensitized aluminum plates for use in graphic printing.

The invention claimed is:

1. A lithographic printing plate comprising a composition sensitive to radiation in electromagnetic spectrum ranges for printing purposes, comprising:
   (a) a mixture of binding polymers;
   (b) an ethylenically unsaturated compound;
   (c) one or more compounds capable of forming free radicals in a selected region of the spectrum;
   (d) a sensitizer;
   (e) a dye; and
   (f) an adhesion promoter,
   wherein said mixture of binding polymers comprises polyvinyl acetal polymers and acrylic polymers and a weight ratio between the polyvinyl acetal and the acrylic polymer ranges from 3:1 to 1:3, and wherein said dye is selected from the group consisting of pthalocyanin blue and a preparation of dye blue in polyvinyl butyral containing 50% dye.

2. The printing plate according to claim 1, wherein said ethylenically unsaturated compound is a monomer or oligomer having at least one terminal ethylene group.

3. The printing plate according to claim 2, wherein said ethylenically unsaturated compound is selected from the group consisting of pentaeritritol tetraacrylate, pentaeritritol methacrylate, dipentaeritritol pentaacrylate, dipentaeritritol pentaacrylate di(methyl propane) tetraacrylate, di(methylol propane) tetramethacrylate, diethylene glycol diacrylate, diethyleneglycol dimetacrylate and oligomers of urethane acrylates and urethane methacrylates having, in the chain, units of propylene diglycol.

4. The printing plate according to claim 1, wherein said one or more compounds capable of forming free radicals is selected from the group consisting of derivatives of acetofenone, benzofenone, benzyl, keto coumarins, alkyl substituted antraquinones, xanthone and thioxanthone, titanocens, hexaarylbiimidazols, triazines substituted with halomethyl, salts of onium and salts of borate.

5. The printing plate according to claim 4, wherein said one or more compounds capable of forming free radicals is selected from the group consisting of 2,2-dimethyl-2-phenylacetofenone, 2-methyl-1-[4-(methylthio)phenyl]-2-morpholino propan-1-one, 3-benzoyl-7-methoxy coumarin, dicyclopentadienyl-Ti dichloride, dicyclopentadienyl-Ti-bisphenyl, dicyclopentadienyl-Ti-bis-2,3,5,6-tetrafluorofen-1-yl, dicyclopentadienyl-Ti-bis-2,4,6-tetrafluorofen-yl, dicyclopentadienyl-Ti-bis-2,6-difluorofen-1-yl, dicyclopentadienyl-Ti-bis-2,4-difluorofen-1-yl, dimethylcyclopentadienyl-Ti-bis-2,3,4,5,6-15-pentafluorofen-1-yl, dimethylcyclopentadienyl-Ti-2,6-15-difluorofen-1-yl, 2,2'-bis(o-chlorophenyl)-4-4',5,5'-tetra(p-fluorophenyl)biimidazol, 2,2'-bis(o-chlorophenyl)-4,4',5,5'-tetra(p-chlorophenyl)biimidazol, 2,2'-bis(o-chlorophenyl)-4,4',5,5'-tetra(o-chlorophenyl)biimidazol, 2,2'-bis(o-chlorophenyl)-4,4',5,5'-tetra (o, p-dichlorophenyl)biimidazol, 2,2'-bis(o-chlorophenyl)-4,4',5,5'-tetra (o,p-dibromophenyl)biimidazol, 2,4-bis (trichloromethyl)-6-(p-methoxy-styryl)-s-triazin, 2,4-bis (trichloromethyl)-6-(4-methoxy-naphth-1-yl)-s-triazin, 2,4-bis(trichloromethyl)-6-piperonyl-s-triazin, diphenyl iodonium chloride, diphenyl idonium hexafluorophosphate, triarylsulfonium hexafluoroantimonate, triarylsulfonium hexafluorophosphate, triarylsulfonium p-toluenesulfonate, tetrabutylamonium triphenyl (n-butyl) borate, diphenyliodonium tetraphenylborate, tetraethylamonium triphenyl(n-butyl)borate, and triphenylsulfonium triphenyl(n-butyl)borate.

6. The printing plate according to claim 1, wherein said sensitizer is selected from the group consisting of cyanin dyes, rhodamin compounds, ethyl 4-dimethylaminobenzoate, dialkylaminobenzene, dialkylaminobenzofenone compounds, 2-(p-dimethylaminophenyl) benzoxazol, 2-(p-diethylaminophenyl)benzoxazol, 2-(p-dimethylaminophenyl) benzo[6,7]benzoxazol, 2,5-bis(p-dimethylaminophenyl)1,3, 4-oxadiazol, 2-phenyl-4-(2-chlophenyl)-5-(4-N,N-diethylaminophenyl)oxazol-1,3, 2-(p-diethylaminophenyl) benzimidazol, 2,5-bis(p-diethylaminophenyl)1,3,4-thiodiazol, (p-dimethylaminophenyl)pyridine, 2-(p-dimethylamionophenyl)quinolin, 2-(p-dimethylaminophenyl)pyrimidin, coumarin compounds, thioxanthene compounds, xanthenes and pyrenes, stylbenes, bis-stirylbenzenes, divinylstilbenes, triazinylaminostilbenes, furanes, benzofuranes, stilbenylnaphthotriazols, bis-triazolstilbenes, benzoxazols, bisphenylbenzoxazols, stilbenylbenzoxazols, diphenyloxadiazol and napthalimides, squarilium, phthalocyanin, indocyanin, cyanin, merocyanin, indolizine, pyrilium and calcogenpyryloarylidene.

7. The printing plate according to claim 1, further comprising a photoaccelerator that comprises, as a radical, a chain transfer agent which is a compound containing sulfur.

8. The printing plate according to claim 1, wherein the adhesion promoter comprises phosphate esters of polyethylene glycol methacrylates.

9. The printing plate according to claim 1, further comprising a thermal polymerization inhibitor selected from the group consisting of hydroquinone, p-methoxyphenol, 2,6-di-butyl-p-cresol and butyl catechol.

10. The printing plate sensitive to radiation in electromagnetic spectrum ranges for printing purposes, comprising a composition as defined in claim 1 and a solvent selected from the group consisting of glycol ethers (ethyleneglycol mono methyl ether, propyleneglycol mono methyl ether), methyl ethyl ketone, methyl isobutyl ketone, tetrahydrofurane, and butyl acetate.

11. A method for preparing a printing plate comprising, providing a lithographic printing plate, the printing plate comprising a pre-treated aluminum substrate;
   applying a composition to a surface of the printing plate, the composition comprising:
      (a) a mixture of binding polymers;
      (b) an ethylenically unsaturated compound;
      (c) one or more compounds capable of forming free radicals in a selected region of the spectrum;
      (d) a sensitizer;
      (e) a dye; and
      (f) an adhesion promoter,
      wherein said mixture of binding polymers comprises polyvinyl acetal polymers and acrylic polymers and a weight ratio between the polyvinyl acetal and the acrylic polymer ranges from 3:1 to 1:3, and wherein said dye is selected from the group consisting of pthalocyanin blue and a preparation of dye blue in polyvinyl butyral containing 50% dye, and wherein after exposure to radiation and after being subjected to a an aqueous developing solution, when dried, forms a film, wherein the pre-treatment of the aluminum substrate comprises: (a) degreasing and deoxidizing the aluminum surface by the action of an alkaline substance, (b) electrochemical treatment, (c) anodization treatment, (d) washing with deionized water, and (e) treating the aluminum surface with a solution of polyvinyl phosphonic acid.

12. The method according to claim 11, wherein the dried film weighs 0.5 g/m$^2$ to 1.5 g/m$^2$.

13. A printing plate, comprising:
   (1) a pre-treated hydrophilic aluminum substrate, wherein the pre-treatment of the aluminum substrate comprises:

(a) degreasing and deoxidizing the aluminum surface by the action of an alkaline substance, (b) electrochemical treatment, (c) anodization treatment, (d) washing with deionized water, and (e) treating the aluminum surface with a solution of polyvinyl phosphonic acid;
(2) a first layer of adhesion promoter solution applied isolated on the surface of the treated aluminum substrate;
(3) a second layer sensitive to Ultraviolet, Violet, or Infrared radiations of the electromagnetic radiation spectrum composed of the photosensitive composition, as defined in claim 1, applied on the aluminum substrate; and
(4) a third layer applied on the second one, impermeable to air oxygen.

14. A graphic printing plate comprising the printing plate according to claim 13.

15. A lithographic printing plate comprising (1) a pretreated hydrophilic aluminum substrate, wherein the pretreatment of the aluminum substrate comprises: (a) degreasing and deoxidizing the aluminum surface by the action of an alkaline substance, (b) electrochemical treatment, (c) anodization treatment, (d) washing with deionized water, and (e) treating the aluminum surface with a solution of polyvinyl phosphonic acid;
(2) a first layer of adhesion promoter solution applied isolated on the surface of the treated aluminum substrate;
(3) a second layer sensitive to Ultraviolet, Violet, or Infrared radiations of the electromagnetic radiation spectrum composed of a photosensitive composition, applied on the aluminum substrate; and
(4) a third layer applied on the second layer, impermeable to air oxygen, and wherein said photosensitive composition comprises:
(a) a mixture of binding polymers;
(b) an ethylenically unsaturated compound;
(c) one or more compounds capable of forming free radicals in a selected region of the spectrum;
(d) a sensitizer;
(e) a dye; and
(f) an adhesion promoter,
wherein said mixture of binding polymers comprises polyvinyl acetal polymers and acrylic polymers and a weight ratio between the polyvinyl acetal and the acrylic polymer ranges from 3:1 to 1:3, and wherein said dye is selected from the group consisting of pthalocyanin blue and a preparation of dye blue in polyvinyl butyral containing 50% dye.

16. An image developing process, comprising:
(i) preparing a printing plate as defined in claim 11;
(ii) exposing the plate obtained in step (i) to ultraviolet, violet or infrared radiation,
(iii) developing the plate obtained in step (ii) with an aqueous developing composition, and
(iv) drying the plate obtained in step (iii) to form a protective film on the plate surface.

17. The printing plate according to claim 1, wherein said ethylenically unsaturated compound is a monomer of multifunctional esters of acrylic acid or of methacrylic acid.

18. The printing plate according to claim 1, further comprising a photoaccelerator selected from the group consisting of 2-mercaptobenzothiazol, 2-mercaptobenzoxazol, and 2-mercaptobenzimidazol.

19. The printing plate according to claim 1, further comprising a photoaccelerator.

20. The printing plate according to claim 1, further comprising a thermal polymerization inhibitors.

* * * * *